United States Patent
Meyer, III et al.

(10) Patent No.: US 7,760,502 B2
(45) Date of Patent: Jul. 20, 2010

(54) COOLING SYSTEM EMPLOYING A HEAT EXCHANGER WITH PHASE CHANGE MATERIAL, AND METHOD OF OPERATION THEREOF

(75) Inventors: Robert Ernst Meyer, III, Rochester, MN (US); Cary Michael Huettner, Rochester, MN (US); Joseph Kuczynski, Rochester, MN (US); Timothy Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 11/876,849

(22) Filed: Oct. 23, 2007

(65) Prior Publication Data

US 2009/0103266 A1 Apr. 23, 2009

(51) Int. Cl.
*H05K 7/20* (2006.01)
(52) U.S. Cl. .............. 361/699; 361/700; 361/701; 361/704; 361/706; 174/15.1; 165/80.4
(58) Field of Classification Search ............... None
See application file for complete search history.

(56) References Cited

U.S. PATENT DOCUMENTS

| | | | | |
|---|---|---|---|---|
| 4,609,036 A * | 9/1986 | Schrader | ............ | 165/10 |
| 6,169,247 B1 * | 1/2001 | Craft et al. | ............ | 174/15.1 |
| 6,970,355 B2 * | 11/2005 | Ellsworth et al. | ............ | 361/694 |
| 7,086,247 B2 | 8/2006 | Campbell et al. | | |
| 7,286,356 B2 * | 10/2007 | Keenan et al. | ............ | 361/700 |
| 7,315,448 B1 * | 1/2008 | Bash et al. | ............ | 361/701 |
| 7,327,578 B2 * | 2/2008 | Novotny | ............ | 361/724 |

OTHER PUBLICATIONS

"IBM Rear Door Heat eXchanger", pp. 1-2, Apr. 2005.
http://www-03.ibm.com/press/us/en/pressrelease/7775.wss, "IBM UnVeils Breakthrough "Cool Blue" Datacenter Cooling Technology", pp. 1-3, printed Jun. 13, 2007.
IBM, "Installation of Cool Blue Rear Door Heat eXchanger", pp. 1-2, Jan. 2007.
http://searchdatacenter.techtarget.com/originalContent/0,289142,sid8, "Cool Blue: How IBM beats the heat", printed Jun. 13, 2007.
http://www.itweek.co.uk/articles/print/2190783, "IBM details green datacentre innovations", pp. 1-3, printed Jun. 13, 2007.
http://www-03.ibm.com/press/us/en/pressrelease/21524.wss, "IBM Unveils Plan to Combat Data Center Energy Crisis; Allocates $1 Billion to Advance "Green" Technology and Services", pp. 1-7 printed Jun. 13, 2007.

* cited by examiner

*Primary Examiner*—Boris L Chervinsky
(74) *Attorney, Agent, or Firm*—Rabin & Berdo, PC

(57) ABSTRACT

A heat exchanger for use, e.g., in a rear door of a server rack in a computer room, made up of pipes clad with a layer of a phase change material, such as a paraffin, so that latent heat is absorbed in the conversion from the solid to the liquid state. Preferably, each pipe in turn is opened by a control valve and chilled coolant flows through the pipe until the phase change material reverts back to the solid state. Then, the control valve is again closed, and the phase change material is further heated by waste heat so that it is melted once more. Preferably, the control valve for only one pipe at a time is opened, so that latent heat is being absorbed by the phase change material around all pipes but one.

19 Claims, 5 Drawing Sheets

COOLING SYSTEM EMPLOYING A HEAT EXCHANGER WITH PHASE CHANGE MATERIAL, AND METHOD OF OPERATION THEREOF

BACKGROUND OF THE INVENTION

1. Field of the Invention

The invention relates to a cooling system employing a heat exchanger with phase change material, and method of operation thereof, such as a heat exchanger that may be applied to a rear door of a server rack, and to a method of controlling the flow of coolant therein.

2. Description of the Background

Large computer server rooms include racks of servers that generate a great deal of heat. Further, as server capacity has grown, there has been a tendency to spread servers further apart so that the heat is easier to dissipate. This wastes floor space. Excess heat needs to be removed from such an environment, not only to ensure the proper functioning of the servers, but also to provide a comfortable working situation for employees.

Heat may be removed from such a server room by fans or by conventional air conditioning. However, it is not likely that existing building air conditioning would be sufficient, and air conditioning the entire room is a relatively inefficient way to remove the heat from the servers. If the air conditioning is increased to a level sufficient to cool the servers, the overall room temperature may be reduced even to a level where personnel may find it to be too cool. There is therefore a need for a way to cool the server racks directly, rather than the entire room.

One such device that is known in the art is the IBM eServer Rear Door Heat eXchanger, also known as the "Cool Blue® Rear Door". This is a heat exchanger built into a four inch thick rear door adapted to fit a six foot 42U type rack, and includes a number of copper pipes through which water flows. Such a device is estimated to remove 55% of the heat from a fully populated server rack, or to be equivalent to an air conditioner with a capacity of 50,000 BTU.

A heat exchanger element 500 that may be used in the above device is shown in FIG. 5, and is made up of a single pipe, or sections of pipe joined together to form a single pipe, forming a flattened spiral coil 510.

Whilst the "Cool Blue® Rear Door" offers advantages over relying solely upon air conditioning, including reduced energy consumption and consequently reduced carbon emissions, it still leaves room for improvements that are the subject of this application.

SUMMARY OF THE INVENTION

One problem that the Applicants have identified with the background art is that the cooling fluid, such as water, must be kept above the dew point to avoid condensation that leads to corrosion, whereas if the coolant were colder more heat could be removed. In the background art, the water is maintained at a temperature of 18° Celsius (about 64° Fahrenheit), i.e. as cool as possible whilst definitely remaining above the dew point, so that condensation is not formed. Accordingly, the present invention enables the coolant to be cooler than this, but without causing this problem.

Another problem that the Applicants have identified with the background art is that water has a limited capacity to absorb heat. However, water is cheap and readily available. A need therefore exists for a way to enhance the heat absorbing properties of a heat exchanger that uses a liquid coolant such as water flowing through a number of pipes.

It is, therefore, a principle object of this invention to provide a cooling system employing a heat exchanger with phase change material, and method of operation thereof.

It is another object of the invention to provide a cooling system employing a heat exchanger with phase change material, and method of operation thereof, which solves the above mentioned problems.

These and other objects of the present invention are accomplished by the cooling system employing a heat exchanger with phase change material, and method of operation thereof, as disclosed herein.

In an exemplary aspect of the invention, a heat exchanger is provided in which the pipes are clad with a layer of a phase change material, such as a paraffin, so that latent heat is absorbed in the conversion of the phase change material from the solid to the liquid state.

Further, according to a preferred embodiment of the invention, each pipe in turn is opened by a control valve and chilled coolant flows through the pipe until the phase change material reverts back to the solid state. Then, the control valve is again closed, and the phase change material is further heated by waste heat so that it is melted once more.

Preferably, the control valve for only one pipe at a time is opened, so that at any given time latent heat is being absorbed by all pipes but one, or rather by the phase change material around each pipe but one, but other schemes are possible without departing from the scope of the invention.

Whilst the heat exchanger of the present invention is preferably designed to be used in a rear door of a server rack in a computer room, it will be appreciated by those skilled in the art that the invention is applicable to a heat exchanger installed in a different location relative to the server rack, and to heat exchangers generally for any other application, not merely limited to cooling computers.

DETAILED DESCRIPTION OF THE INVENTION

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

Figure 1:
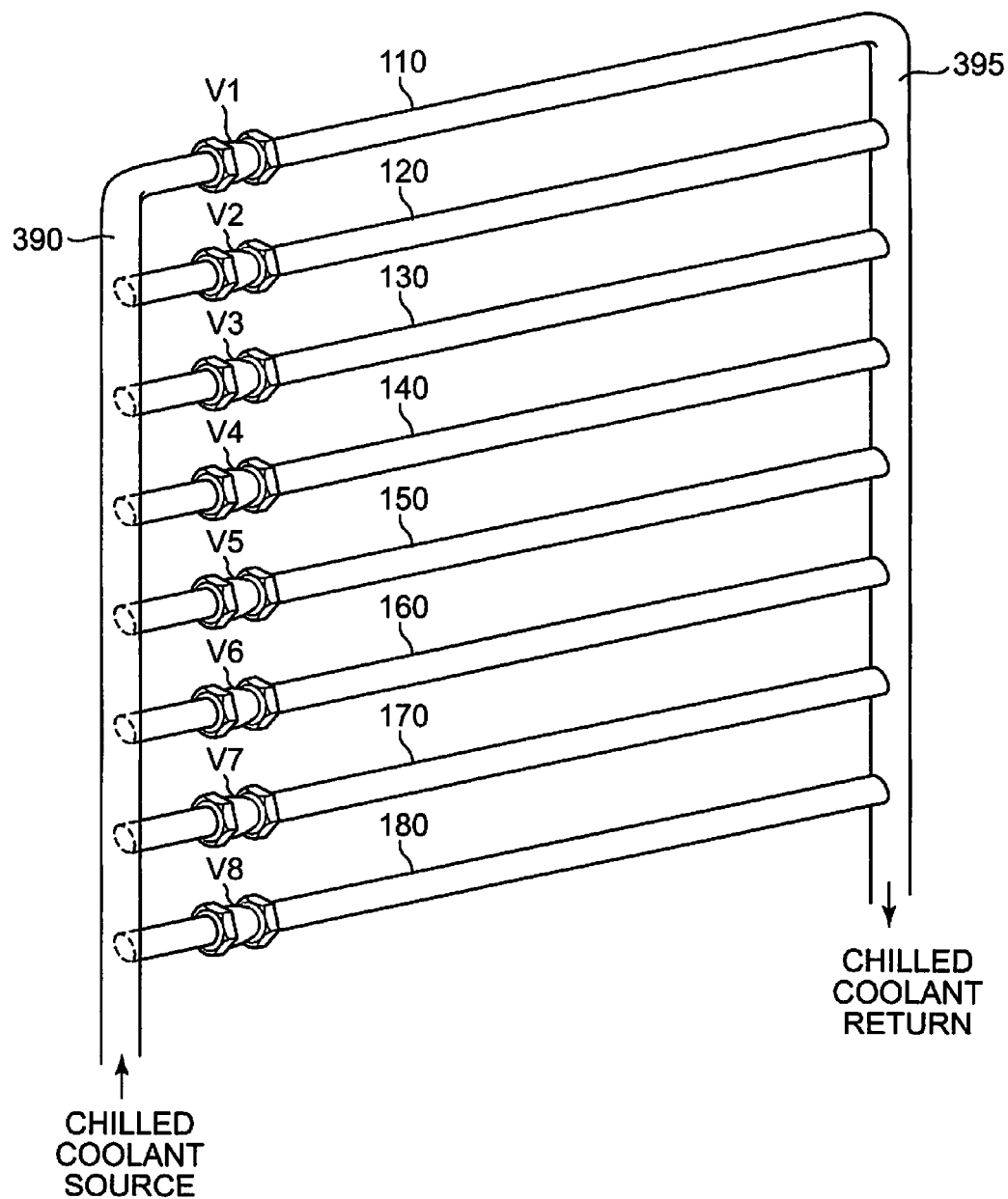
FIG. 1 shows a heat exchanger according to the invention.

The present invention is directed toward a cooling system employing a heat exchanger with phase change material, and method of operation thereof, such as a heat exchanger that may be applied to a rear door of a server rack, and to a method of controlling the flow of coolant therein A rear door heat exchanger according to a preferred embodiment of the present invention includes a heat exchanger element 100 as shown in FIG. 1, made up of separate coils of pipe 110, 120, 130, 140, 150, 160, 170 and 180. It will, of course, be appreciated by those skilled in the art that the actual number of coils is not critical, and neither is the number of turns in each coil, which may even be straight pipes rather than coils.

Figure 2:
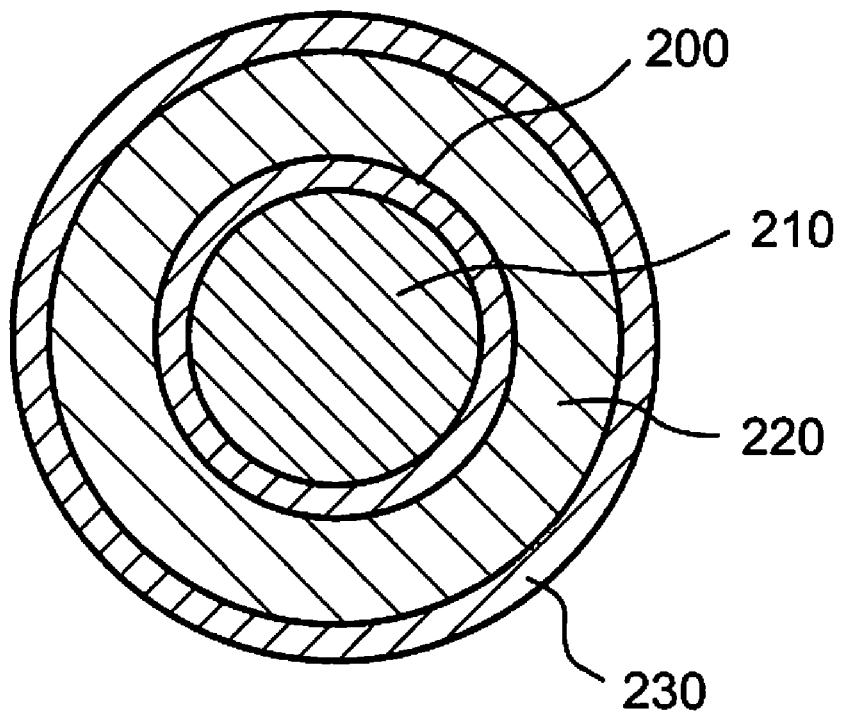
FIG. 2 shows a pipe according to the invention.

Coils 110, 120, 130, 140, 150, 160, 170 and 180 preferably have a structure as shown in cross-section in FIG. 2, made up of a metal pipe 200, for example a copper pipe, to carry a chilled coolant 210, such as water, where the metal pipe 200 is at least partially surrounded by a layer of phase change material 220, in turn surrounded by a membrane 230 having a high thermal conductivity. The highly conductive thermal membrane 230 is primarily in place to contain the phase change material 220 while maintaining the ability to flex during the actual changing of phases. The outer membrane 230 needs to conduct heat well, in addition to being able to withstand the volume fluctuations during phase changes. Steel and polyethylene are examples of materials that could be used for the highly conductive thermal membrane 230. The phase change material 220 may be, in a preferred embodiment, a paraffin (such as octadecane), but any other suitable material may be employed. However, other possible phase change materials (PCMs) that might be employed include salt hydrates, fatty acids and esters. Recently, ionic liquids have also been investigated for use as PCMs. An important characteristic of the phase change material 220 is that it should change phases, such as between the liquid and solid phases, within the temperature range of the chilled coolant 210.

Figure 3:
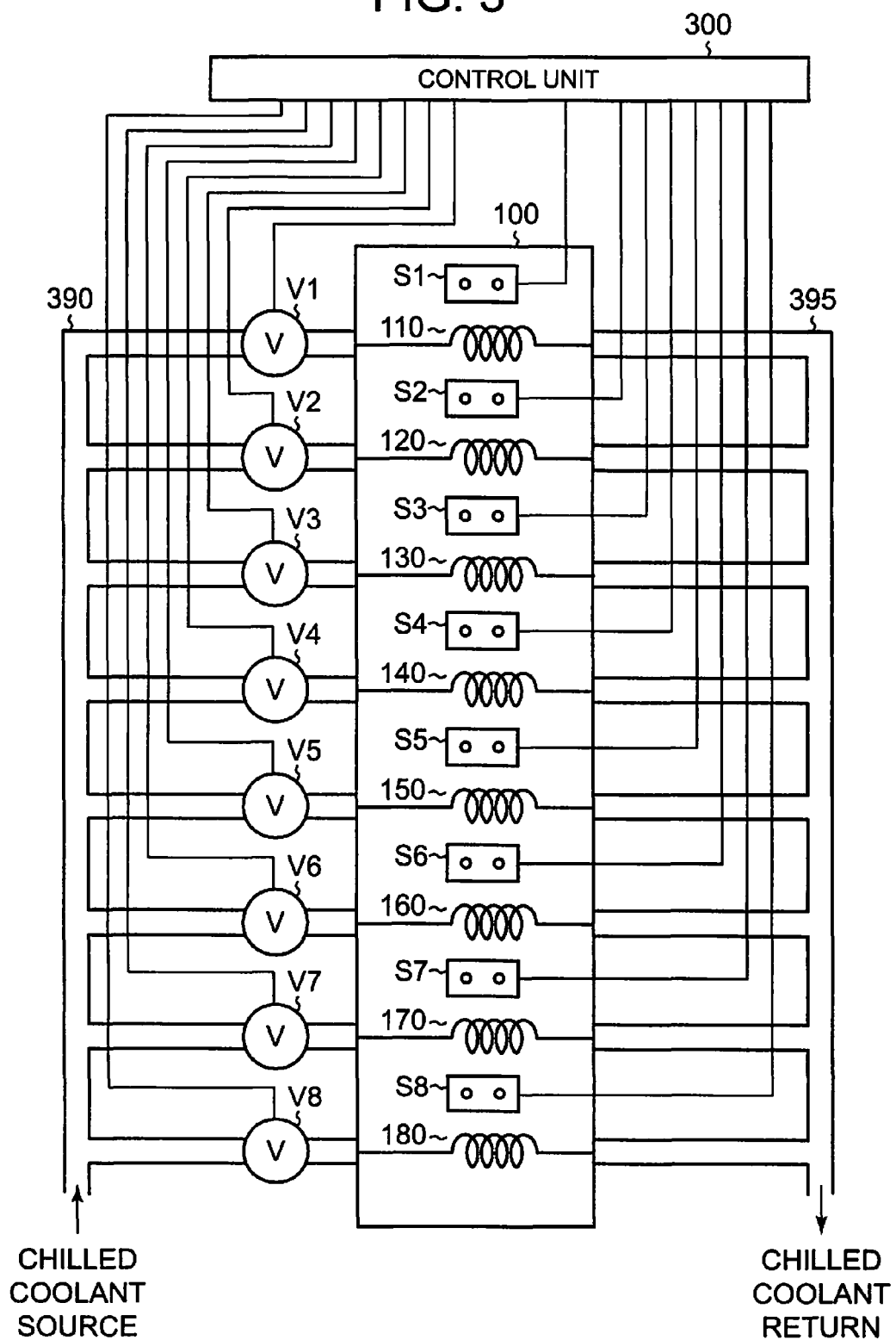
FIG. 3 shows a cooling system according to the invention.

FIG. 3 shows a cooling system according to a preferred embodiment of the invention, where chilled coolant is supplied via intake manifold 390 to valves V1, V2, V3, V4, V5, V6, V7 and V8 to selectively supply the coolant to the respective coils 110, 120, 130, 140, 150, 160, 170 and 180 of heat exchanger element 100, and the coolant is returned via outlet manifold 395.

Sensors S1, S2, S3, S4, S5, S6, S7 and S8 may be provided for each coil 110, 120, 130, 140, 150, 160, 170 and 180 respectively to detect when the phase change material has changed from the liquid to the solid phase, such as by detecting the temperature. Any suitable control unit 300, such as one employing a microprocessor or microcontroller, may be used to control the valves V1, V2, V3, V4, V5, V6, V7 and V8 based on the temperature of the respective coils 110, 120, 130, 140, 150, 160, 170 and 180 as measured by sensors S1, S2, S3, S4, S5, S6, S7 and S8 respectively. Motorized valves that may be controlled in this way are well known in the art, and so will not be described here.

In operation, in a preferred embodiment of the invention, each of the valves V1, V2, V3, V4, V5, V6, V7 and V8 is opened in turn to supply chilled water to the respective coil 110, 120, 130, 140, 150, 160, 170 or 180, and then closed again when a respective sensor S1, S2, S3, S4, S5, S6, S7 or S8 respectively detects that the temperature of the respective coil 110, 120, 130, 140, 150, 160, 170 or 180 has fallen below a value that indicates that the phase change material around the coil has solidified, and then the next valve is opened after the previous valve has been closed.

Figure 4:
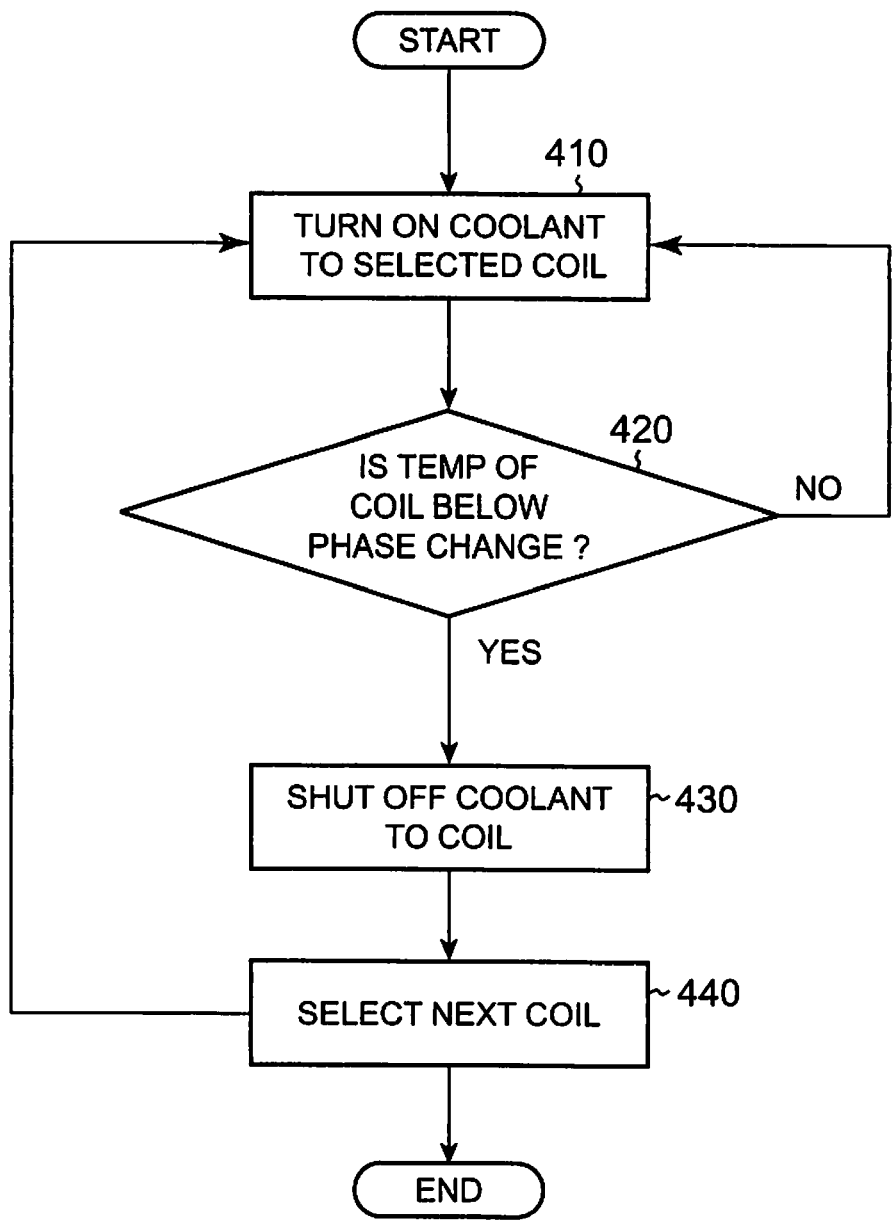
FIG. 4 is a flowchart of a method of cooling according to the invention.
Figure 5:
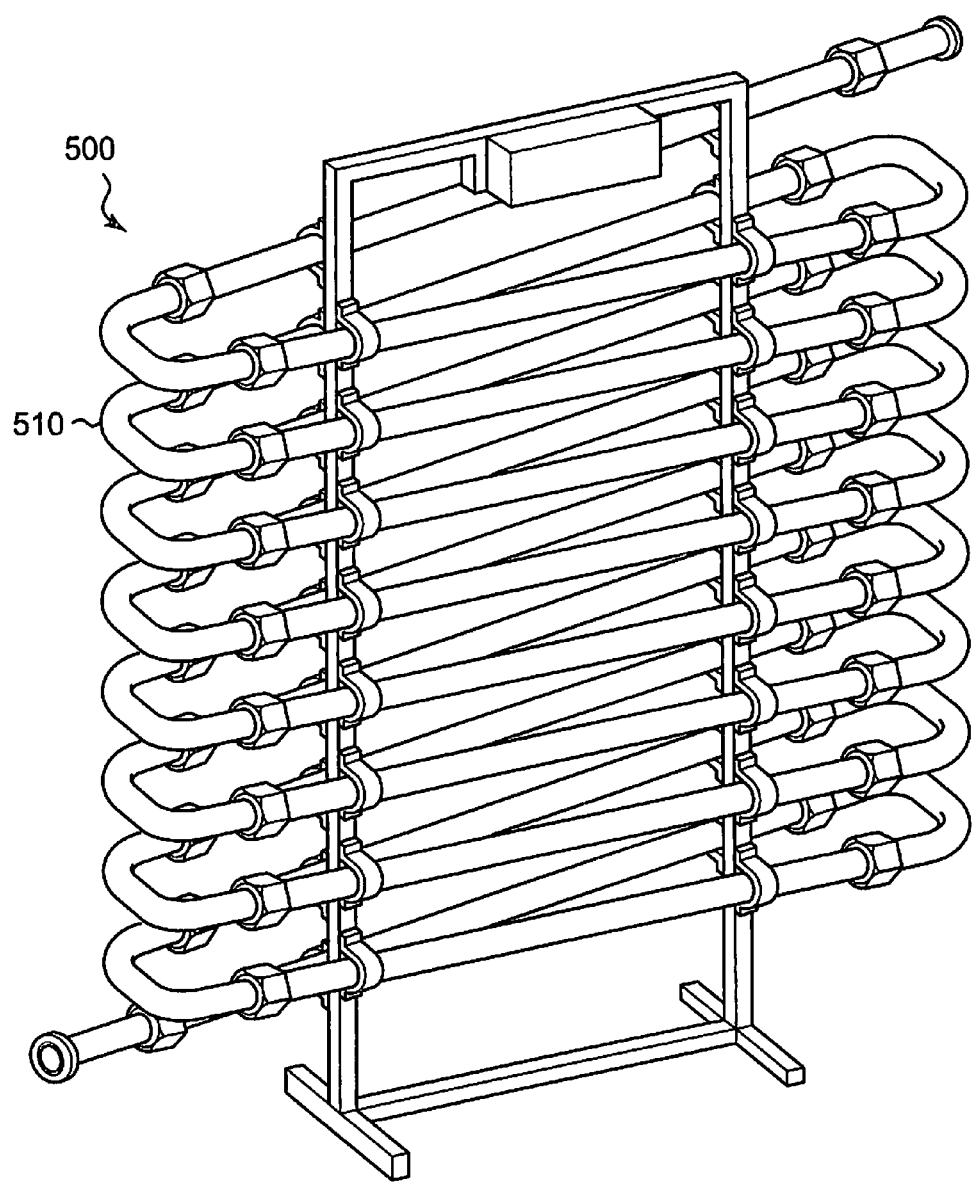
FIG. 5 shows a heat exchanger according to the prior art.

FIG. 4 is a flow chart of a preferred embodiment of the above method, in which the supply of chilled coolant to a selected coil is turned on in step 410, then in step 420 the temperature of the selected coil is sensed. If the temperature of the selected coil indicates that the phase change material has solidified, then the method continues to step 430, otherwise the method returns to step 410. In step 430, the supply of chilled water to the selected coil is turned off, then in step 440 a new coil is selected, and then the method returns to step 410. This process repeats continuously, removing heat from the apparatus to be cooled. It will, of course, be appreciated that the next coil selected may or may not be adjacent to the previously selected coil, and that more than one coil may be selected at the same time without departing from the scope of the invention.

It should be understood, however, that the invention is not necessarily limited to the specific process, arrangement, materials and components shown and described above, but may be susceptible to numerous variations within the scope of the invention. For example, although the above-described exemplary aspects of the invention are believed to be particularly well suited for a heat exchanger for a rear door of a server rack, and to a method of controlling the flow of coolant therein, it is contemplated that the concepts of the present invention can be applied in other applications. For example, the concepts of the present application can be utilized whenever it is desired to enhance the operation of a heat exchanger.

In addition, embodiments of the present invention may also be delivered as part of a service engagement with a corporation, nonprofit organization, government entity, internal organizational structure, or the like. Aspects of these embodiments may include designing, deploying, and configuring a computing system containing the cooling systems and/or practicing the cooling methods described herein. Further aspects of these embodiments may include analyzing the client's operations, creating recommendations responsive to the analysis, building systems that implement portions of the recommendations, integrating the systems into existing processes and infrastructure, metering use of the systems, allocating expenses to users of the systems, and billing for use of the systems.

It will be apparent to one skilled in the art that the manner of making and using the claimed invention has been adequately disclosed in the above-written description taken together with the drawings.

It will be understood that the above description of the preferred embodiments are susceptible to various modifications, changes and adaptations, and the same are intended to be comprehended within the meaning and range of equivalence of the appended claims.

What is claimed is:

1. A cooling system, comprising a heat exchanger, the heat exchanger further comprising:
    a plurality of pipes,
    a phase change element employing a phase change material in thermal contact with at least one of said pipes,
    a layer of said phase change material surrounding said at least one of said pipes.

2. The cooling system according to claim 1, wherein said phase change material exhibits a phase change between liquid and solid states.

3. The cooling system according to claim 2, wherein said phase change material is a paraffin.

4. The cooling system according to claim 1, wherein said layer of said phase change material is surrounded by a layer of high thermal conductivity material.

5. The cooling system according to claim 4, wherein said layer of high thermal conductivity material is a membrane.

6. The cooling system according to claim 1, wherein said at least one pipe of the heat exchanger is a copper pipe formed as a coil.

7. The cooling system according to claim 1, wherein said plurality of pipes are arranged in a door of a computer rack.

8. The cooling system according to claim 1, further comprising;
    a sensor configured to detect a phase change in said phase change element;

a control valve configured to control admission of a coolant into said at least one of said pipes; and a control unit configured to initially open said control valve to admit said coolant into said at least one of said pipes and then close said control valve when said sensor detects the phase change in said phase change element.

9. The cooling system according to claim 8, wherein the coolant is water.

10. The cooling system according to claim 8, wherein said sensor detects whether the phase change has occurred by detecting a temperature of the phase change element.

11. The cooling system according to claim 8, wherein said control unit is configured to admit said coolant into each of said plurality of pipes according to a predetermined sequence.

12. The cooling system according to claim 11, wherein said control unit is configured to admit said coolant sequentially into adjacent pipes of said plurality of pipes.

13. A method of cooling, comprising the following acts:
  initiating a supply of coolant to the at least one pipe of a heat exchanger;
  detecting whether a phase change has occurred in phase change material associated with the at least one pipe after the act of initiating the supply of coolant; and
  controlling the supply of coolant to the at least one selected coil if the phase change is detected in the step of detecting.

14. The method according to claim 13, wherein the act of detecting whether a phase change has occurred comprises detecting a temperature of the phase change material.

15. The method of claim 13, further comprising
  selecting at least one pipe of a heat exchanger; and
  repeating the acts of selecting, initiating, detecting, controlling.

16. The method according to claim 15, wherein adjacent pipes of the heat exchanger are each selected sequentially.

17. The method according to claim 15, wherein more than one pipe of the heat exchanger is selected at a time.

18. A method for deploying computing infrastructure, comprising integrating a heat exchanger into a computing system, wherein the heat exchanger in combination with the computing system is adapted to perform the method of claim 13.

19. The method according to claim 13, wherein the act of controlling comprises turning off the supply of coolant.

* * * * *